United States Patent
Wass et al.

(10) Patent No.: US 9,099,913 B2
(45) Date of Patent: Aug. 4, 2015

(54) METHOD AND DEVICE FOR ESTIMATING THE CLAMPING FORCE ON A WINDING PACKAGE OF A TRANSFORMER OR A REACTOR

(75) Inventors: Torbjorn Wass, Vasteras (SE); Tord Bengtsson, Vasteras (SE)

(73) Assignee: ABB RESEARCH LTD. (CH)

( * ) Notice: Subject to any disclaimer, the term of this patent is extended or adjusted under 35 U.S.C. 154(b) by 1301 days.

(21) Appl. No.: 12/945,621

(22) Filed: Nov. 12, 2010

(65) Prior Publication Data

US 2011/0112777 A1 May 12, 2011

Related U.S. Application Data (63) Continuation of application No. PCT/EP2009/055643, filed on May 11, 2009.

(30) Foreign Application Priority Data

May 14, 2008  (EP) .................................. 08156186

(51) Int. Cl.
  *G01R 31/27*  (2006.01)
  *H02M 1/00*  (2007.01)
  *G01R 31/02*  (2006.01)

(52) U.S. Cl.
  CPC ............... *H02M 1/00* (2013.01); *G01R 31/027* (2013.01)

(58) Field of Classification Search
  USPC .......................... 702/41, 56, 79, 108, 183, 58
  See application file for complete search history.

(56) References Cited

U.S. PATENT DOCUMENTS

| 4,857,856 | A * | 8/1989 | Coleman et al. ............... 324/547 |
| 6,466,034 | B1 * | 10/2002 | Wang et al. .................... 324/547 |
| 8,219,335 | B2 * | 7/2012 | Marti et al. ...................... 702/65 |
| 2006/0207331 | A1 | 9/2006 | Lysen | |

FOREIGN PATENT DOCUMENTS

| CN | 1776441 A1 | 5/2006 |
| CN | 2864705 Y | 1/2007 |
| EP | 0279577 A1 | 8/1988 |

(Continued)

OTHER PUBLICATIONS

Patel, et al.; "Dynamic Response of Power Transformer Under Axial Short Circuit Forces Part II—Windings and Clamps as a Combined Systems"; Transactions on Power Apparatus and Systems; Sep. 1, 1973; 10 pages.

European Search Report; Application No. EP 08 15 6186; Oct. 24, 2008; 8 pages.

(Continued)

*Primary Examiner* — Mohamed Charioui
(74) *Attorney, Agent, or Firm* — Whitmyer IP Group LLC (57) ABSTRACT

A method and a device for estimating the winding clamping force on a winding package of a transformer or a reactor, the winding package comprising at least one winding with connections and an iron core. The device includes a current pulse generator configured to generate a current pulse sufficient to excite the winding, means for supplying the current pulse to the winding, a sensor for measuring vibrations of the transformer or the reactor generated by the current pulse, and a computing unit configured to calculate a mechanical resonant frequency based on the measured vibrations and to estimate the clamping forces on the winding packages based on the calculated mechanical resonant frequency and a predetermined relation between the expected mechanical resonant frequency and the clamping force.

13 Claims, 4 Drawing Sheets

(56) References Cited

FOREIGN PATENT DOCUMENTS

| | | | |
|---|---|---|---|
| FR | 2427736 A1 | 12/1979 | |
| GB | 2028504 A | 3/1980 | |
| JP | 55061258 A | 5/1980 | |
| JP | 61235712 A | 10/1986 | |
| JP | 2004318492 A | 11/2004 | |
| SU | 1390643 A1 | 4/1988 | |
| WO | 02095346 A1 | 11/2002 | |

OTHER PUBLICATIONS

International Preliminary Report on Patentability; PCT/EP2009/055643; Aug. 25, 2010; 13 pages.
International Search Report and Written Opinion of the International Searching Authority; PCT/EP2009/055643; Sep. 28, 2009; 10 pages.
Shengehang, et al.; "The Vibration Measuring System for Monitoring Core and Winding Condition of Power Transformer"; Electrical Insulating Materials, 2001; 4 pages.

* cited by examiner

METHOD AND DEVICE FOR ESTIMATING THE CLAMPING FORCE ON A WINDING PACKAGE OF A TRANSFORMER OR A REACTOR

CROSS-REFERENCE TO RELATED APPLICATIONS

The present application is a continuation of pending International patent application PCT/EP2009/055643 filed on May 11, 2009 which designates the United States and claims priority from European patent application 08156186.2 filed on May 14, 2008, the content of which is incorporated herein by reference.

FIELD OF THE INVENTION

The present invention relates to a method and a device for estimating the clamping force on a winding package of a transformer or a reactor, the winding package comprising at least one winding with connections and an iron core. The invention is practical and useful for determining the winding clamping forces of an in-service power transformer on site.

BACKGROUND OF THE INVENTION

Power transformers need to withstand the dynamic effects of short circuit without damage. However during a short circuit, the electromagnetic forces on the winding package of a power transformer are very large. Therefore, the windings are clamped to resist the electromagnetic forces during a short circuit. Due to the material ageing and shrinking, repeated thermal cycling, short circuits and so on, the clamping forces decrease during the lifetime of the transformer. A decreased clamping force will consequently reduce the short circuit withstand capability of a power transformer. Therefore it is important to assess how rigidly the winding packages are clamped to assure the short circuit withstanding capability of a transformer.

To determine the clamping forces of a winding package of a power transformer, conventionally the transformer interior is inspected, for example by measuring the torque of the bolts of the press plate, which however requires that the transformer be put out of service for a considerable time while the transformer has to be drained from oil and often the active part has to be lifted out of the tank. Additionally, there is always a risk of contamination whenever a transformer tank is opened.

It is known that the strongly non-linear strain-stress characteristic of the pressboard used in the transformer insulation gives rise to a mechanical resonant frequency that is dependent on the clamping forces on the windings. If the clamping force is reduced the mechanical resonant frequency is shifted to lower frequencies. Thus by determining the mechanical resonant frequency the clamping forces can be determined.

A patent SU1390643 has disclosed a method for inspecting the quality of impregnating windings of electrical devices, such as motors, transformer coils, chokes, etc. The inspecting is based on the physical phenomenon of vibration generated by passing a pulse current through the winding, thereon the quality of the winding is evaluated from vibration signal.

A numerical method for determining the mechanical resonant frequency of windings can be found in a paper, entitled "Dynamic response of power transformers under axial short circuit forces, Part 2—Winding and clamps as a combined system", IEEE Transactions on Power Apparatus and Systems, Volume PAS-92, No 5, September-October 1973, pp. 1567-1576. This method presents a numerical solution, or a mathematical model to calculate the mechanical resonant frequency of the windings, the calculated resonant frequencies then being compared with tested ones. The paper has acknowledged that the non-linear strain-stress of pressboard used in the transformer insulation gives rise to the mechanical resonant frequency of winding that depends on clamping forces. However, the method is based on a mathematical model to calculate the mechanical resonant frequency of windings rather than a measurement directly on site. This means that a verification of the model has to be carried out. However, this is not practical for a transformer on site since it is based on coils in a laboratory as the used technique.

Although it is suggested that the clamping force can be determined by analysis of transformer vibrations, and the mechanical resonant frequency of the winding is known to be dependent on clamping forces on the windings of a transformer, no useful and practical method to determine the mechanical resonant frequency of a winding package of a transformer exists today.

It is also of general interest to know how much a transformer or a reactor sounds. One way to find it out is to determine the resonant frequencies of the transformer or the reactor. There is a need to determine the resonant frequencies in a practical way, for example on site and without complicated operations.

SUMMARY OF THE INVENTION

One object of the present invention is to provide an improved method for determining the mechanical resonant frequency of a vibration mode for a winding package of a transformer or a reactor suitable to be carried out on site.

Such a method comprises supplying a current pulse to the connections of the winding in order to excite the winding, measuring vibrations of the winding package generated by the current pulse, calculating the mechanical resonant frequency based on the measured vibrations, and estimating the clamping forces on the winding packages based on the calculated mechanical resonant frequency and a predetermined relation between the expected mechanical resonant frequency and the clamping force.

When a winding is exposed to an impact it will oscillate in a plurality of vibration modes. However, a particular vibration mode is needed to be identified or measured depending on the purpose of an application. According to the invention, by supplying a current pulse, the winding is excited in the desired vibration mode.

Although current excitations can excite the windings, not all of them excite the desired vibration mode with sufficient strength. For example, the steady state 50 Hz current during normal operation only excites 50 Hz and its harmonics. Thus, this method has a limitation.

According to the invention, a current pulse is injected through the winding. Thereby, a current is generated in this winding and the desired vibration mode is excited.

The invention makes it possible to excite the desired vibration mode. Therefore, for example, this is a simple and practical method to determine the mechanical resonant frequency of the desired vibration mode for a transformer comparing to draining out the oil inside a transformer to allow inspection of the interior. The vibrations can be measured simply by attaching a measuring apparatus on the outside of the tank wall of a transformer. The mechanical resonant frequency of windings can be simply calculated based on the measured vibrations.

Among vibration experts, the desired vibration mode is classified as an axial symmetric vibration mode with fixed ends for a winding package of a transformer.

By determining the mechanical resonant frequency of the axial symmetric vibration mode the clamping forces can be estimated. In order to determine the mechanical resonant frequency of the axial symmetric vibration mode, the winding should be excited in axial symmetric vibration mode. The vibrations of the windings can be measured and the mechanical resonant frequency of windings that affects the clamping can be calculated based on the measured vibrations. The clamping force of the windings can be estimated based on the calculated mechanical resonant frequency and a predetermined relation between the mechanical resonant frequency and the clamping force. If the calculated mechanical resonant frequency is lower than the expected mechanical resonant frequency, a reduced clamping force of a transformer is indicated since when the clamping forces is reduced the mechanical resonant frequency is shifted to lower frequency.

Establishing a relation between the mechanical resonant frequency and the clamping force makes the invention more practical and useful.

According to an embodiment of the invention, the predetermined relation between the expected mechanical resonant frequency and the clamping is estimated mathematically based on the rated power and rated voltage of the transformer. According to an embodiment of the invention, the winding package of the transformer comprises a first and a secondary winding with connections, the method comprising electrically arranging the connections of the secondary winding so that the windings are effectively excited in the desired vibration mode when the current pulse is supplied to the connections of the first winding.

According to a preferred embodiment of the invention, the connections of the secondary winding are arranged so that the secondary winding is short-circuited. With the secondary winding short-circuited, all windings are excited at the same time in the same desired axial symmetric vibration mode as during a short circuit. A further advantage with the secondary winding short-circuited is that since the impedance of the first winding is much lower, the current pulse needs much lower voltage than the rated voltage to excite the windings. Therefore, the voltage needed is not an overvoltage that will damage the winding insulation.

According to an embodiment of the invention, the current pulse has a rise time that is close to or shorter than the rise time of the expected mechanical resonant frequency. This enhances the excitation of the axial symmetric resonance over other resonances. Otherwise, either numerous resonances or no resonances are excited. Numerous resonances result in a difficulty to single out the desired resonance. An expected mechanical resonant frequency of the windings of a transformer can roughly be calculated in advance according to the type of the transformer.

The method according to the invention is thus useful for determining clamping forces on winding packages of a transformer.

Another object of the invention is to provide a device for determining the mechanical resonant frequency of a vibration mode for a winding package of a transformer or reactor.

Such a device comprises a current pulse generator configured to generate a current pulse sufficient to excite the winding, means for supplying the current pulse to the winding, a sensor for measuring vibrations of the transformer or the reactor generated by the current pulse, and a computing unit configured to calculate the mechanical resonant frequency based on the measured vibrations and to estimate the clamping forces on the winding packages based on the calculated mechanical resonant frequency and a predetermined relation between the expected mechanical resonant frequency and the clamping force.

Such a device can be used as a non-destructive diagnostic tool to determine the winding clamping forces of a transformer or a reactor on site. A measuring performed by such a device will not harm the windings since the voltage used is not an overvoltage.

According to an embodiment of the invention, the sensor is an accelerometer. To measure the vibrations, the accelerometer is just placed on the outside the tank wall of a transformer or a reactor. The position can be either above or below the winding. Using an accelerometer to obtain proper amplitude of the signal is economic and it is easy to perform measuring on site.

According to an embodiment of the invention, the pulse generator comprises an electrical circuit to be connected to the first winding, including a capacitor, a DC voltage supply arranged to charge the capacitor, and a switch configured, upon activation, to generate a current pulse by discharging the capacitor.

To inject a current pulse the capacitor is charged by the DC voltage supply and then discharged over the first winding by switching on the switch.

With the secondary winding short-circuited, the apparent impedance of the first winding is lower; therefore, only 10-20% of the rated voltage is needed to obtain a current close to the rated current, which assures that the voltage needed is not an overvoltage that will damage the winding insulation. Furthermore, it is practical to perform measuring without a need for the rated voltage. A rated voltage needs a capacitor with more capacitance, which may increase the complexity of building such a device.

According to an embodiment of the invention, a diode is arranged in parallel with the capacitor. One advantage with the diode is that the current pulse is unipolar and not oscillating. Thus, the excitation pulse can excite resonances in a wider frequency range, which makes the invention more flexible in a way that it can be used to determine the mechanical resonant frequencies of windings in some range. For example, the mechanical resonant frequencies of a transformer with a rated power 200 MVA can be in a range of 75-140 Hz. Additionally, it is ensured that the voltage over the capacitor is always positive. When the voltage becomes negative, the capacitor is discharged over the diode.

According to an embodiment of the invention, the capacitor together with the winding inductance forms an electrical resonant circuit. The capacitor is selected so that the resonant frequency of the electrical resonant circuit is close to or higher than the expected mechanical resonant frequency of the windings.

To excite the axial symmetric resonance, the capacitance of the capacitor should be sufficient. A sufficient capacitance determines a proper rise time of the current pulse in order to excite the axial symmetric resonance.

When signal data of the axial symmetric vibrations are acquired, the computing unit calculates the axial symmetric resonances by using some well-known analysis methods, for example, Fast Fourier Transform analysis.

Such a device is easy to construct for estimating the clamping forces on the windings of a winding package of a transformer.

BRIEF DESCRIPTION OF THE DRAWINGS

The invention will now be explained more closely by the description of different embodiments of the invention and with reference to the appended figures.

DETAILED DESCRIPTION OF THE INVENTION

Essentially, an axial force can be created either by a mechanical impact, for example a hit with a hammer, or electrically by a current pulse through the winding. It is known that with the mechanical impact numerous resonances are excited, which make it difficult or almost impossible to identify the resonant frequency of the windings. Additionally, it is impossible to perform such a mechanical impact on site. Alternatively the current excitation can be used to excite the winding. The current excitation mainly excites the windings, which make it possible to find the mechanical resonant frequency when the windings oscillate by the axial force.

The simplest excitation is the steady state 50 Hz current during normal operation. But this current only excites 50 Hz and its harmonics. The mechanical resonant frequency of the windings is only excited at inrush and then disappears in the steady state. Therefore, the mechanical resonant frequencies are hard to find using this method. Alternatively, an inrush current can be used to excite the windings. Such a method can be performed by closing the breakers on one side of the transformer while leaving the breakers on the other side open. The inrush current can excite over a wider spectrum than the 50 Hz steady state, however it excites the core and other parts of the transformer at the same time as well. Therefore, it is very difficult to single out the mechanical resonant frequency of the windings from the other resonances.

In the following the method of the invention will be explained in connection with a transformer, however the invention is also applicable to a reactor.

Figure 1:
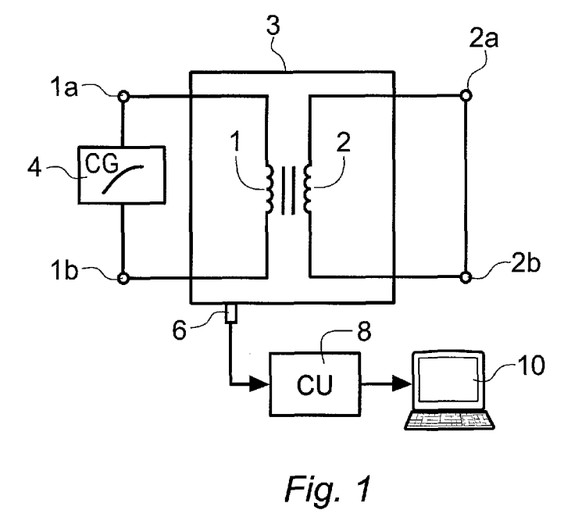
FIG. 1 shows a device for determining the mechanical resonant frequency of a vibration mode of the windings in a winding package of a transformer, according to an embodiment of the invention.

FIG. 1 illustrates a device for determining the mechanical resonant frequency of a vibration mode of the windings in a winding package of a transformer, according to an embodiment of the invention. As shown in FIG. 1, the winding package comprises a first winding 1 and a secondary winding 2 with connections 1*a*, 1*b*, 2*a*, and 2*b*. A current generator 4 is connected to the connections 1*a*, 1*b* of the first winding 1. The function of the current generator 4 is to generate a current pulse to create an axial force that excites the windings in the desired vibration mode. A sensor 6, for example an accelerometer, is placed at the bottom of a tank wall 3 for measuring the signals of the vibrations. The vibrations measured by the sensor are acquired by a computing unit 8. Further on, the mechanical resonant frequencies are calculated based on the measured vibrations and results are displayed on a display unit 10.

The connections 2*a*, 2*b* of the secondary winding 2 should be electrically arranged so that the current pulse excites both windings. In the embodiment shown in FIG. 1, the connections of the secondary winding are short-circuited. This arrangement simulates a short circuit. In another case, the winding package of a transformer may include two or more secondary windings. Then all of the secondary windings are short-circuited. In case of a reactor, the secondary winding 2 does not exist and therefore this step is omitted.

Alternatively, with the secondary winding 2 open, the impedance of the first winding 1 is high and, therefore, a voltage that is close to a rated voltage is needed to be able to excite the windings in the desired vibration mode. This may risk an overvoltage.

An advantage with the invention is that it excites only the mechanical resonant frequency with a current pulse, which makes it easy to measure the vibrations. Another advantage is that the current pulse excitation excites over a relatively broad spectrum. Thus, the invention can be applied to a wide range of transformers to estimate the clamping forces of the transformers.

When the current pulse is injected through the first winding, with the secondary winding properly electrical arranged, in this example short-circuited, the current pulse creates an axial force, which further on makes the windings oscillate. The vibrations pass through the oil and to the tank wall. The amplitude of the signal can be very dependent on the sensor position but the frequency should not change for different positions of the sensor. The mechanical connection from the winding to the sensor can be seen as a filter, increasing and decreasing different frequencies. Different sensor positions can therefore enhance different frequencies. The best position is probably at a stiff construction detail with a natural resonant frequency that is much higher than the mechanical resonant frequency. In this example, the sensor is placed at the bottom of the tank wall.

The computing unit 10 performs acquisition of the signal data of the vibrations, calculates the axial symmetric resonances by using some well-known analysis methods, for example FFT, and displays the calculated results on the display unit 10.

Figure 2A:
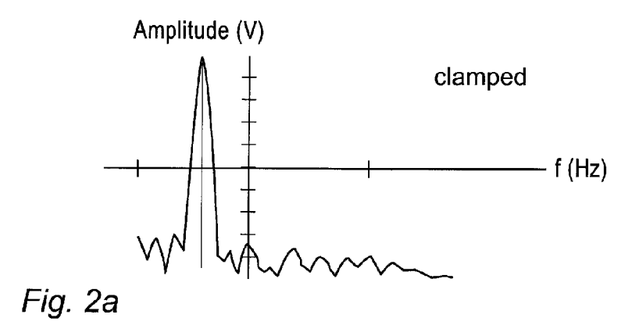
FIG. 2*a-c* shows an example of how the mechanical resonant frequency depends on the clamping force by a comparison of well clamped cases (FIG. 2*a* and FIG. 2*c*) and an almost unclamped case (FIG. 2*b*).
Figure 2B:
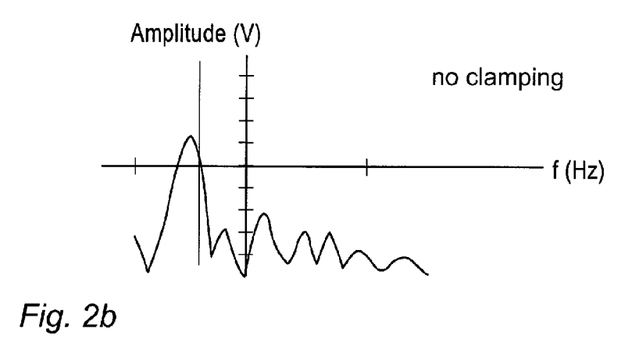
Figure 2C:
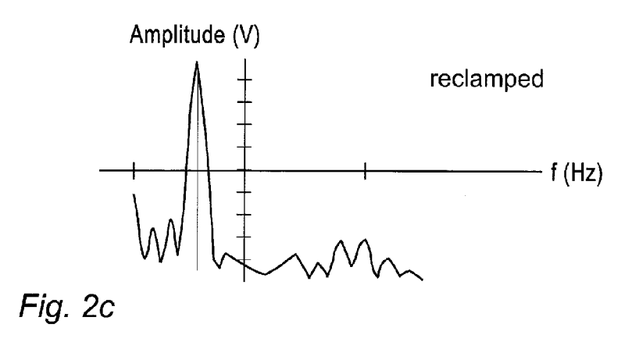

FIG. 2*a*-2*c* acknowledges the dependency of the mechanical resonant frequency on a clamping force. As illustrated, an increased clamping force results in an increased mechanical resonant frequency. For example, FIG. 2*a* shows a significant mechanical resonant frequency when the windings are clamped, whereas FIG. 2*b* shows that the mechanical resonant frequency is decreased when there is no clamping on the windings. FIG. 2*c* shows that the mechanical resonant frequency is increased again when the windings are re-clamped.

The mechanical resonant frequency is denoted the first axial symmetric mode with both ends fixed, in the following denoted "$f_2$ fix-fix".

It is known that the non-linear stress-strain characteristic of the pressboard of a transformer gives rise to the $f_2$ fix-fix that is dependent on the clamping force. Consequently, when the windings are excited in the $f_2$ fix-fix mode, the mechanical resonant frequency $f_2$ fix-fix of a transformer can be calculated based on the measured vibrations and a detailed mechanical model of the transformer.

Figure 3:
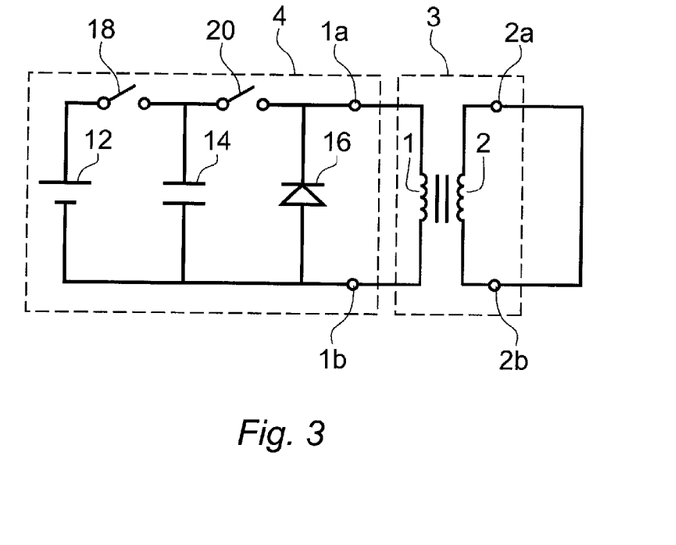
FIG. 3 shows an example of the electric scheme of the current pulse generator, according to an embodiment of the invention.

FIG. 3 shows an example of an electric scheme of the current pulse generator 4 according to an embodiment of the invention. The electrical circuit of the current pulse generator 4 comprises a DC voltage supply 12, a capacitor 14, a diode 16 and two switches 18 and 20. Alternatively an electric scheme without the switch 18 is also applicable.

In this configuration, the current pulse generator 4 is connected to the connections 1*a*, 1*b* of the first winding 1. The connections 2*a*, 2*b* of the secondary winding 2 are short-circuited.

One of the terminals of the DC voltage supply 12 is connected to one of the connections 1*a* of the first winding 1 via the switches 18 and 20. The other terminal is connected to the other connection 1b of the first winding. Preferably, the magnitude of the DC voltage supply is in the range of 10-20% of the transformer rated voltage. The function of the DC voltage supply is to charge the capacitor 14. The capacitor is arranged in parallel with the DC voltage supply. The capacitance of the capacitor is dependent on the required rise time of the current pulse as discussed below. The function of the capacitor is to store the energy to generate the current pulse. The switch 18 is arranged between the DC voltage supply and the capacitor. The function of the switch 18 is to charge the capacitor when it is closed. The switch 20 is arranged between the capacitor 14 and the diode 16. The function of the switch 20 is to discharge the capacitor to inject the current pulse to the first winding when it is closed. The capacitor 14 together with the winding inductance forms an electrical resonant circuit. The diode 16 is arranged in parallel with the capacitor. The function of the diode is to eliminate oscillation of the electrical resonance circuit when the current pulse is generated.

To inject a current pulse into the first winding 1, the capacitor 14 is charged by the DC voltage supply 12 with the switch 18 closed and the switch 20 open, and then the capacitor is discharged by closing the switch 20.

In order to only excite the mechanical resonant frequency, the current pulse should be injected with a rise time $t_{rise}$ close to or shorter than the rise time t of the expected mechanical resonant frequency. This means that the electrical resonant frequency $f_0$ of the current should be close to or higher than the mechanical resonant frequency $f_2$ fix-fix. The electrical resonant circuit has an electrical resonant frequency $$f_0 = \frac{1}{2\pi}\frac{1}{\sqrt{LC}} \tag{1}$$

where $f_0$ is the electrical resonant frequency, L is the short-circuit inductance of the transformer and C is the capacitance of the capacitor 14.

$$L = uk\frac{U_N^2}{P_N \omega_N} \tag{2}$$

where $U_N$ the rated voltage, $P_N$ the rated power, $\omega_N$ the network frequency and uk the short-circuit impedance.

C is the capacitance of the capacitor which can be calculated from the formulas (1) and (2).

$$C = \frac{1}{(2\pi f_0)^2 L} = \frac{P_N \omega_N}{(2\pi f_0)^2 uk U_N^2} \tag{3}$$

For example, for the current with a rated frequency 50 Hz, to get a current pulse with the same peak current $I_{peak}$ as the rated current, the capacitor 14 should be charged with $U_{peak}$, $$U_{peak} = Z*I_{peak} = \omega_0 L * \frac{P}{\sqrt{3}}\frac{\sqrt{2}}{U_N} = \sqrt{\frac{2}{3}} uk * U_N \frac{f_0}{50} \tag{4}$$

where Z is the short-circuit impedance, $$Z = 2\pi f_0 L = f_0 uk\frac{U_N^2}{P_N f_N} \tag{5}$$

If the current pulse is injected in a quarter of sine period, then we have a rise time as $$t_{rise} = \frac{1}{4}\frac{1}{f_0} \tag{6}$$

The needed capacitance is calculated as follows:

$$C = \frac{1}{(2\pi f_0)^2 L} = \frac{4t_{rise}^2}{\pi^2 L} \tag{7}$$

Without a detailed model of a transformer, the expected mechanical resonance $f_2$ could roughly be estimated from the rated power and rated voltage of a transformer as $$f_2 \propto \frac{1}{\sqrt{MVA}} \tag{8}$$

where MVA is the rated power of a transformer. Therefore, a relation between the expected mechanical resonant frequency and clamping force may be predetermined.

Figure 4:
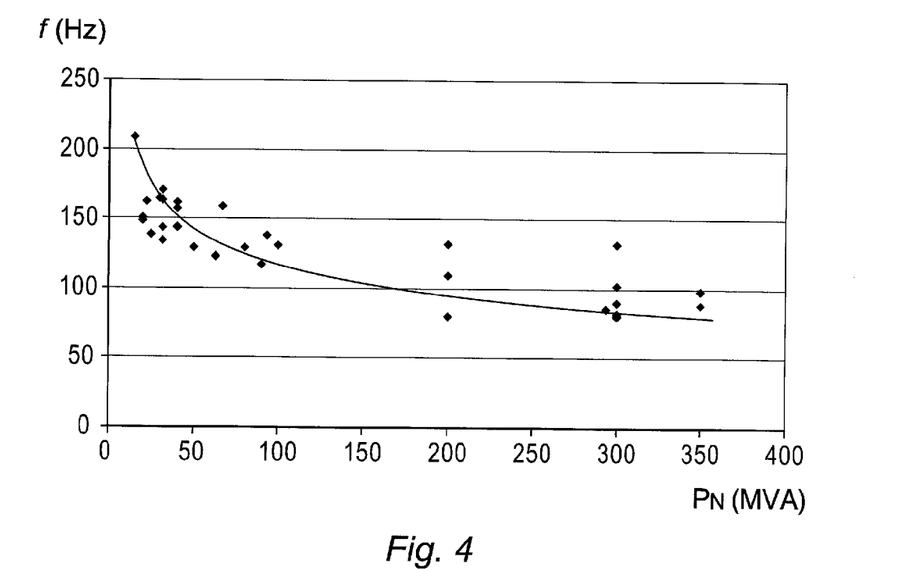
FIG. 4 shows the estimation of an expected mechanical resonant frequency as a function of rated power for different types of transformers.

FIG. 4 shows that the expected mechanical resonant frequency of windings is estimated as a function of rated power for different types of transformers. The figure illustrates that different types of transformers have different winding resonances. Because the electrical resonant frequency $f_0$ of the current pulse should be close to or higher than the mechanical resonant frequency $f_2$ fix-fix, $f_2$ in formula (8) can be used in the formula (6) to determine the rise time $t_{rise}$ and therefore the capacitance C can be determined with the formula (7). FIG. 4 also shows that for a transformer with a rated power as 200 MVA, the mechanical resonant frequencies can be in a range of 75-140 Hz. To estimate the clamping force, the calculated mechanical resonant frequency may be compared with the expected resonant frequency, if the calculated mechanical resonant frequency is lower than the expected mechanical resonant frequency a reduced clamping force is indicated.

Figure 5A:
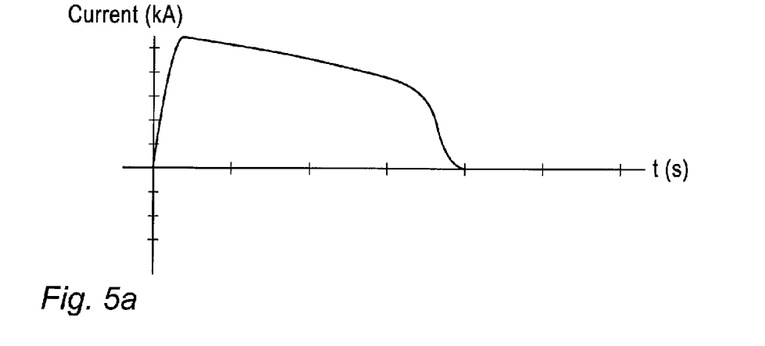
FIG. 5*a* shows the current through the winding during the current pulse with a finite rise time.

FIG. 5a shows the current through the winding during the current pulse. The current reaches its peak at the rise time $t_{rise}$. FIG. 5a also shows that, with a diode arranged in parallel with the capacitor, the currents are maintained by the inductance and slowly decay due to the losses in the winding after a current reaches its peak.

Figure 5B:
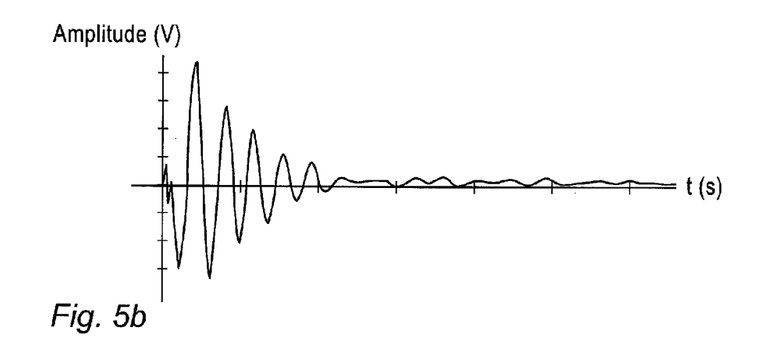
FIG. 5*b* shows the measured vibration on the windings during the current pulse in FIG. 5*a*.

FIG. 5b shows the measured vibration on the windings during the current pulse shown in FIG. 5a. Note that the rise time of the oscillation is roughly the same as $t_{rise}$.

Figure 5C:
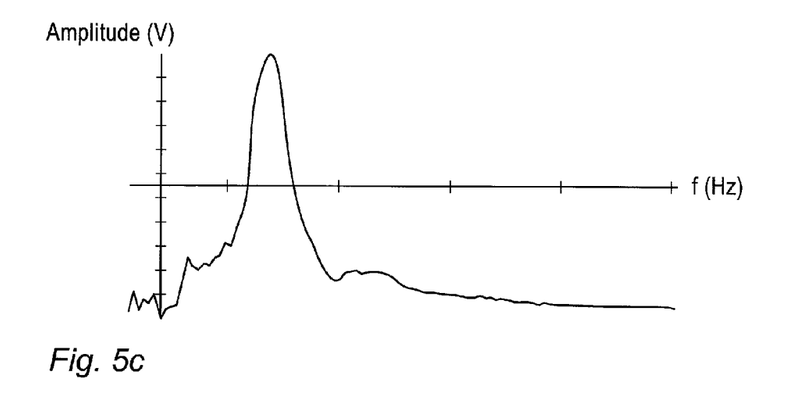
FIG. 5*c* shows the spectrum of the vibration signal in FIG. 5*b*.

FIG. 5c shows the spectrum of the vibration signal in FIG. 5b. The peak value is an estimate of the mechanical resonant frequency, which can, for example, be used for estimating the clamping force on the windings of a transformer.

To be able to calculate the resonant frequency based on the measured vibrations of the windings, several methods can be used. For example, the digital Fourier transform is an effective algorithm for spectral analysis. In addition, fitting methods can be applied in cases where spectral analysis is not suitable. For one example, since the current pulse excitation gives a short duration of the signal, the spectral analysis should be performed in a rather short time frame to avoid influences from disturbance. However, due to the property of the Fourier transform the frequency resolution, $\Delta f$, is limited because of $\Delta f=1/T$, where T is the time duration of the analyzed signal. For another example, the Fourier analysis sometimes gives a broad bump with several peaks. Then it is very difficult to determine the appropriate frequency.

We will now give an example of a possible fitting method that fits an appropriate part of the signal, $\Phi(t)$, to $$\phi(t) = A \sin(\omega_{fit} t + \rho) e^{-t/\tau} + V_{DC} \tag{9}$$

where A is the amplitude, $\omega_{fit}$ is the angular frequency, $\rho$ is the phase, $\tau$ is the damping and $V_{DC}$ is the DC offset of the signal. Although $\omega_{fit}$ is of main interest, the other parameters are required to find it. The fitting method relies on minimizing the square sum of deviations between $\Phi(t)$ and $\phi(t)$:

$$d = \sum_{t=Tstart}^{t=Tend} |\Phi(t) - \varphi(t)|^2 \tag{10}$$

The procedure is as follows:
1. Starting values for all parameters are selected;
2. An initial step is established for each parameter;
3. For each parameter:
   a. Change by the step until d no longer decreases;
   b. New parameter value is at minimum d.
4. Decrease step;
5. If the step is larger than the prescribed value, which can be set by an operator, return to 3;
6. Ready.

This method is quite sensitive to initial values. Therefore, the operator may need to adjust the initial values to help the algorithm to converge. Especially the initial amplitude and frequency are sensitive in this respect.

With these two methods, the mechanical resonances can be calculated based on the measured vibrations and the clamping forces on a winding package of a transformer can be estimated.

What is claimed is:

1. A method for estimating a clamping force on a winding package of a transformer or a reactor, the winding package comprising at least one winding with connections and an iron core, wherein the method comprises the steps of:
   supplying a current pulse to the connections of the winding in order to excite the winding in a vibration mode,
   measuring vibrations of the winding package generated by the current pulse,
   calculating a mechanical resonant frequency based on the measured vibrations, and
   estimating the clamping force on the winding package based on the calculated mechanical resonant frequency and a predetermined relation between expected mechanical resonant frequency and clamping force.

2. The method according to claim 1, wherein said vibration mode is an axial symmetric vibration mode with fixed ends for a winding package of a transformer.

3. The method according to claim 1, wherein said winding package of the transformer comprises a first and a secondary winding with connections, the method further comprising the step of electrically arranging the connections of the secondary winding so that the windings are excited in the vibration mode, and the current pulse is supplied to the connections of the first winding.

4. The method according to claim 3, wherein the connections of the secondary winding are arranged so that the secondary winding is short-circuited.

5. The method according to claim 1, wherein the current pulse has a rise time that is close to or shorter than the rise time of the expected mechanical resonant frequency.

6. The method according to claim 1, wherein the predetermined relation between the expected mechanical resonant frequency and the clamping is estimated mathematically based on the rated power and rated voltage of the transformer.

7. A device for determining a mechanical resonant frequency of a vibration mode for a winding package of a transformer or a reactor, the winding package comprising at least one winding with connections and an iron core, characterized in that the device comprises:
   a current pulse generator connected to the winding and configured to generate a current pulse sufficient to excite the winding,
   a sensor for measuring vibrations of the transformer or the reactor generated by the current pulse, and
   a computing unit configured to calculate said mechanical resonant frequency based on the measured vibrations and to estimate a clamping force on the winding package based on the calculated mechanical resonant frequency and a predetermined relation between expected mechanical resonant frequency and clamping force.

8. The device according to claim 7, said winding package of the transformer comprising a first and a secondary winding with connections, wherein the connections of the secondary winding are electrically arranged so that the windings are excited in the desired vibration mode, and the current pulse is supplied to the connections of the first winding.

9. The device according to claim 8, wherein the connections of the secondary winding are arranged so that the secondary winding is short-circuited.

10. The device according to claim 7, wherein said sensor is an accelerometer.

11. The device according to claim 7, wherein the pulse generator comprises an electrical circuit to be connected to the winding, including a capacitor, a DC voltage supply arranged to charge the capacitor, and a switch configured, upon activation, to generate a current pulse by discharging the capacitor.

12. The device according to claim 11, wherein a diode is arranged in parallel with the capacitor.

13. The device according to claim 11, wherein the capacitor inductance together with the winding inductance forms an electrical resonant circuit and, the capacitor is selected so that the resonant frequency of the electrical resonant circuit is close to or higher than the expected mechanical resonant frequency of the windings.

* * * * *